(12) United States Patent
Goto et al.

(10) Patent No.: US 12,069,837 B2
(45) Date of Patent: Aug. 20, 2024

(54) HEAT DISSIPATION MEMBER AND METHOD OF MANUFACTURING THE SAME

(71) Applicant: DENKA COMPANY LIMITED, Tokyo (JP)

(72) Inventors: Daisuke Goto, Omuta (JP); Hiroaki Ota, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 477 days.

(21) Appl. No.: 17/425,541

(22) PCT Filed: Jan. 29, 2020

(86) PCT No.: PCT/JP2020/003090
§ 371 (c)(1),
(2) Date: Jul. 23, 2021

(87) PCT Pub. No.: WO2020/158775
PCT Pub. Date: Aug. 6, 2020

(65) Prior Publication Data
US 2022/0369499 A1    Nov. 17, 2022

(30) Foreign Application Priority Data
Jan. 30, 2019    (JP) .................... 2019-013765

(51) Int. Cl.
*H05K 7/20*    (2006.01)
*B28B 3/02*    (2006.01)
(Continued)

(52) U.S. Cl.
CPC ........... *H05K 7/2039* (2013.01); *B28B 3/025* (2013.01); *C04B 35/575* (2013.01);
(Continued)

(58) Field of Classification Search
CPC .... H05K 7/2039; B28B 3/025; C04B 35/575; C04B 41/4523; C04B 41/5155; C04B 41/88; C04B 2235/3418; C04B 2235/3826
(Continued)

(56) References Cited

U.S. PATENT DOCUMENTS 6,447,894 B1    9/2002 Hirotsuru et al.
6,914,321 B2    7/2005 Shinohara
(Continued)

FOREIGN PATENT DOCUMENTS

CN    101361184 A    2/2009
CN    105580131 A    5/2016
(Continued)

OTHER PUBLICATIONS

Feb. 23, 2022 Extended Search Report issued in European Patent Application No. 20747772.0.
(Continued)

*Primary Examiner* — Joel M Attey
(74) *Attorney, Agent, or Firm* — Oliff PLC

(57) ABSTRACT

Among two main surfaces of a heat dissipation member, one main surface is curved to be convex in an outward direction and the other convex in an inward direction. When a straight line passing through both endpoints $P_1$ and $P_2$ of the curve is $l_1$, a point at which a distance to $l_1$ on the curve is maximum is $P_{max}$, an intersection point between $l_1$ and a perpendicular drawn from $P_{max}$ to $l_1$ is $P_3$, a middle point of a line segment $P_1P_3$ is $P_4$, an intersection point between the curve and a straight line that passes through $P_4$ and is perpendicular to $l_1$ is $P_{mid}$, a length of the line segment $P_1P_3$ is L, a length of a line segment $P_3P_{max}$ is H, and a length of a line segment $P_4P_{max}$ is h, (2 h/L)/(H/L) is 1.1 or more.

8 Claims, 4 Drawing Sheets

(51) Int. Cl.
*C04B 35/575* (2006.01)
*C04B 41/45* (2006.01)
*C04B 41/51* (2006.01)
*C04B 41/88* (2006.01)
*C09K 5/14* (2006.01)
*F28F 21/04* (2006.01)
*F28F 21/08* (2006.01)

(52) U.S. Cl.
CPC ...... *C04B 41/4523* (2013.01); *C04B 41/5155* (2013.01); *C04B 41/88* (2013.01); *C09K 5/14* (2013.01); *F28F 21/04* (2013.01); *F28F 21/089* (2013.01); *C04B 2235/3418* (2013.01); *C04B 2235/3826* (2013.01); *F28F 2215/04* (2013.01); *F28F 2215/10* (2013.01)

(58) Field of Classification Search
USPC .......................................................... 165/133
See application file for complete search history.

(56) References Cited

U.S. PATENT DOCUMENTS

| | | | |
|---|---|---|---|
| 10,032,648 | B2 | 7/2018 | Oohiraki et al. |
| 10,595,403 | B2 | 3/2020 | Naba et al. |
| 10,952,317 | B2 | 3/2021 | Naba et al. |
| 11,292,751 | B2 * | 4/2022 | Itadu .................. C04B 40/0075 |
| 11,746,683 | B2 * | 9/2023 | Sommier ............. F01N 3/2013 60/320 |
| 2002/0113302 | A1 | 8/2002 | Shinohara |
| 2006/0150597 | A1 * | 7/2006 | Masukawa ......... B01D 46/2451 55/523 |
| 2008/0138568 | A1 * | 6/2008 | Tomita ............... B01D 46/2422 501/141 |
| 2009/0280351 | A1 | 11/2009 | Hirotsuru et al. |
| 2010/0242426 | A1 * | 9/2010 | Ohara ................ B01D 46/2482 55/523 |
| 2012/0165179 | A1 * | 6/2012 | Reilly ................. C04B 41/5155 264/642 |
| 2016/0254209 | A1 | 9/2016 | Oohiraki et al. |
| 2017/0162469 | A1 | 6/2017 | Kino et al. |
| 2017/0236767 | A1 | 8/2017 | Miyakawa et al. |
| 2017/0317007 | A1 | 11/2017 | Goto et al. |
| 2019/0150278 | A1 | 5/2019 | Naba et al. |
| 2019/0297725 | A1 * | 9/2019 | Iwayama .............. C22C 1/1073 |
| 2020/0178387 | A1 | 6/2020 | Naba et al. |
| 2020/0373251 | A1 | 11/2020 | Hirotsuru et al. |

FOREIGN PATENT DOCUMENTS

| | | |
|---|---|---|
| CN | 106796920 A | 5/2017 |
| EP | 2 012 354 A1 | 1/2009 |
| EP | 3 553 817 A1 | 10/2019 |
| EP | 3595001 A1 | 1/2020 |
| JP | 2002-246515 A | 8/2002 |
| JP | 3468358 B2 | 11/2003 |
| JP | 2005-145746 A | 6/2005 |
| JP | 2008-042011 A | 2/2008 |
| JP | 6591114 B1 | 10/2019 |
| WO | 2015/053316 A1 | 4/2015 |
| WO | 2015/115649 A1 | 8/2015 |
| WO | 2018/012616 A1 | 1/2018 |
| WO | 2018/105297 A1 | 6/2018 |
| WO | 2018/163864 A1 | 9/2018 |
| WO | 2019/026836 A1 | 2/2019 |

OTHER PUBLICATIONS

Apr. 21, 2020 International Search Report issued in International Patent Application No. PCT/JP2020/003090.
Aug. 13, 2021 Office Action issued in Chinese Patent Application No. 202080006007.8.

* cited by examiner

HEAT DISSIPATION MEMBER AND METHOD OF MANUFACTURING THE SAME

TECHNICAL FIELD

The present invention relates to a heat dissipation member and a method of manufacturing the same. More specifically, the present invention relates to a plate-shaped heat dissipation member including a metal-silicon carbide composite containing aluminum or magnesium and a method of manufacturing the same.

BACKGROUND ART

Recently, as a heat dissipation component for a power module in an electric vehicle or an electric railway, a heat dissipation member formed of a metal-silicon carbide composite has been used instead of copper in the related art.

As the metal of the metal-silicon carbide composite, aluminum or an alloy thereof is used frequently.

In many cases, the heat dissipation member is used in a state where it is joined to another component (for example, a heat dissipation fin or a heat dissipation unit), and characteristics of the junction portion are important.

For example, when the heat dissipation member is joined to another component, in general, the heat dissipation member is screwed and fixed to the other component using a hole provided in a peripheral portion of the heat dissipation member. However, when a surface of the heat dissipation member in contact with another component is concave or when many fine uneven portions are present, a gap may be formed between the heat dissipation member and the other component, and there is a problem in that thermal conductivity deteriorates.

In consideration of the above-described problem, some heat dissipation members are disclosed in which a surface joined to another component is curved to be convex to prevent the formation of a gap between the heat dissipation member and the other component as far as possible.

The reason for this is follows. As described above, typically, the heat dissipation member is used in a state where it is fixed to another component with a fixing member such as a screw. Therefore, by forming the surface joined to the other component to be curved to be convex, the joined surface is "appropriately flat" during fixing with the fixing member, and joinability (adhesion) to the other component is improved.

For example, Patent Document 1 discloses a plate-shaped composite in which a porous silicon carbide compact is impregnated with a metal containing aluminum as a main component, four or more hole portions for screwing a convex surface of the plate-shaped composite to another heat dissipation component are provided in a surface of the plate-shaped composite, and a relationship between a warpage (Cx: μm) per 10 cm in a hole-to-hole direction (X direction) and a warpage (Cy: μm) per 10 cm in a direction (Y direction) perpendicular thereto is 50≤Cx≤250 and −50≤Cy≤200 (excluding Cy=0).

In another example, Patent Document 2 discloses a plate-shaped silicon carbide composite in which a porous silicon carbide compact is impregnated with a metal containing aluminum as a main component, and a warpage per 10 cm of a main surface of the composite is 250 μm or less.

RELATED DOCUMENT

Patent Document

[Patent Document 1] Japanese Patent Application No. 3468358

[Patent Document 2] Pamphlet of International Publication No. WO2015/115649

SUMMARY OF THE INVENTION

Technical Problem

As described above, it is known that, (1) by manufacturing a curved heat dissipation member first and then (2) "flattening" the curve with a force of a fixing member such as a screw during joining to another component, joinability between the heat dissipation member and the other component is improved and further heat dissipation is improved.

However, typically, a surface of the heat dissipation member opposite to the surface in contact with the heat dissipation fin or the like is connected to a component such as a power element. Therefore, when the component is connected to the curved heat dissipation member, in particular, in a mass-production stage, alignment may be difficult or the connection of the component itself may be difficult.

That is, when the component is connected to a single surface of the curved heat dissipation member to manufacture a power module or the like, there is a room for improvement from the viewpoint of manufacturing stability (for example, yield).

The present invention has been made under these circumstances. One object of the present invention is to improve manufacturing stability (for example, yield) when a component is connected to a single surface of a curved heat dissipation member to manufacture a power module or the like.

Solution to Problem

As a result of a thorough investigation, the present inventors completed the present invention provided below and achieved the above-described object.

According to the present invention, there is provided a plate-shaped heat dissipation member including a metal-silicon carbide composite containing aluminum or magnesium, in which the heat dissipation member is substantially rectangular, among two main surfaces of the heat dissipation member, one main surface is curved to be convex in an outward direction of the heat dissipation member and the other main surface is curved to be convex in an inward direction of the heat dissipation member, and in a curve C of the other main surface in a cross-sectional view of the heat dissipation member showing a cross-section that is substantially perpendicular to the heat dissipation member and passes both middle points of two short sides of the other main surface, when a straight line passing through both endpoints $P_1$ and $P_2$ of the curve C is represented by $l_1$, a point at which a distance to $l_1$ on the curve C is maximum is represented by $P_{max}$, an intersection point between $l_1$ and a perpendicular drawn from $P_{max}$ to $l_1$ is represented by $P_3$, a middle point of a line segment $P_1P_3$ is represented by $P_4$, an intersection point between the curve C and a straight line that passes through $P_4$ and is perpendicular to $l_1$ is represented by $P_{mid}$, and a length of the line segment $P_1P_3$ is represented by L, a length of a line segment $P_3P_{max}$ is represented by H, and a length of a line segment $P_4P_{mid}$ is represented by h, (2h/L)/(H/L) is 1.1 or more.

In addition, according to the present invention, there is provided a method of manufacturing the above-described heat dissipation member, the method including:

a preparation step of preparing a metal-silicon carbide composite containing aluminum or magnesium; and a heating press step of interposing the metal-silicon carbide composite between convex and concave molds and heating and pressing the metal-silicon carbide composite.

Advantageous Effects of Invention

According to the present invention, manufacturing stability (for example, yield) can be improved when a component is connected to a single surface of a curved heat dissipation member to manufacture a power module or the like.

BRIEF DESCRIPTION OF THE DRAWINGS

The above-described object, other objects, characteristics, and advantageous effects will be further clarified using preferred embodiments described below and the accompanying drawings below.

FIG. 1(*a*) is a bird's eye view showing the heat dissipation member according to the embodiment and FIG. 1(*b*) is a cross-sectional view of the heat dissipation member taken along a surface α of FIG. 1(*a*).

DESCRIPTION OF EMBODIMENTS

Figure 1:
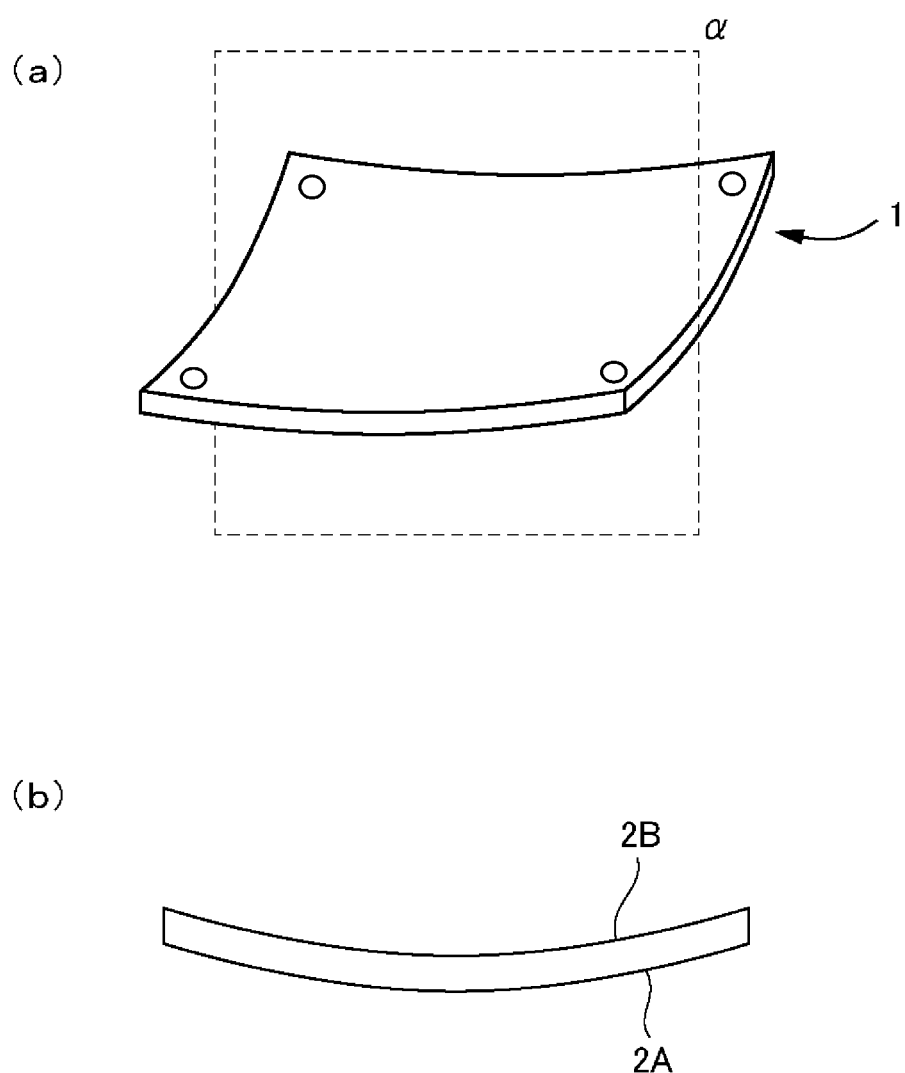
FIG. 1 is a schematic diagram showing a heat dissipation member according to an embodiment.

Hereinafter, embodiments of the present invention will be described in detail with reference to the drawings.

In all the drawings, the same components are represented by the same reference numerals, and the description thereof will not be repeated.

Figure 2:
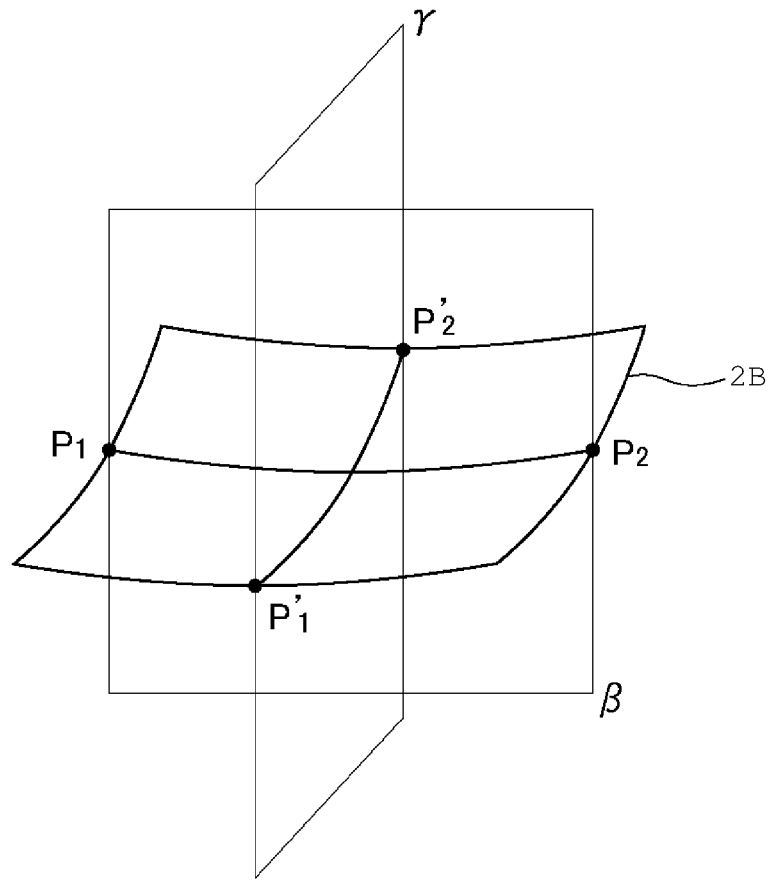
FIG. 2 is a diagram showing the other main surface of the heat dissipation member according to the embodiment.

In order to avoid complication, (i) when a plurality of the same components are present on the same drawing, there may be a case where the reference numeral is given to only one component without giving the reference numeral to all the components; and (ii) in the drawings after FIG. 2, there may be a case where the reference numeral is not given again to the same components as those of FIG. 1.

All the drawings are merely illustrative. The shapes, a dimensional ratio, and the like of each of members in the drawings do not necessarily correspond to those of an actual product. In particular, for easy understanding of the description, a shape or a dimensional ratio may be shown in an exaggerated manner. In particular, in each of the drawings, the size of "curve" is more exaggerated than the actual product.

In the present specification, unless explicitly specified otherwise, the term "substantially" is intended to include a range defined in consideration of manufacturing tolerances, assembly variations, and the like.

<Heat Dissipation Member>

FIG. 1(*a*) is a bird's eye view showing a heat dissipation member (heat dissipation member 1) according to an embodiment.

The heat dissipation member 1 is plate-shaped.

A main material of the heat dissipation member 1 is a metal-silicon carbide composite containing aluminum or magnesium (the details of the material will be described below together with a method of manufacturing the heat dissipation member 1).

The heat dissipation member 1 is substantially rectangular. That is, the heat dissipation member 1 is substantially rectangular in a top view where one main surface or the other main surface is a top surface.

Here, "being substantially rectangular" represents that at least one of four corners of the heat dissipation member 1 may have a slightly rounded shape without being linear (of course, the four corners may be linear).

In a case where at least one of the four corners of the heat dissipation member 1 is processed in a rounded shape, the rectangular "apex" is defined as an intersection point when straight line portions of a short side and a long side of the heat dissipation member 1 in a top view where one main surface of the heat dissipation member 1 is a top surface are extended. In addition, at this time, "the length of the short side" or "the length of the long side" of the heat dissipation member 1 is defined by using the above-described "apex" as a starting point or an end point.

The lengths of the heat dissipation member 1 are, for example, about in a range of 40 mm×90 mm to 140 mm×250 mm.

The thickness of the heat dissipation member 1 is, for example, 2 mm or more and 6 mm or less and preferably 3 mm or more and 5 mm or less. If the thickness of the heat dissipation member 1 is not uniform, it is preferable that the thickness of at least a center-of-gravity portion of the heat dissipation member 1 is in the above-described range. Alternatively, when the thickness of the heat dissipation member 1 is not uniform, it is preferable that the thickness in each of portions other than holes is within the above-described range.

FIG. 1(*b*) is a cross-sectional view of the heat dissipation member 1 taken along a surface α of FIG. 1(*a*).

The plate-shaped heat dissipation member 1 includes two main surfaces (one main surface will be referred to as "main surface 2A", and the other main surface will be referred to as "main surface 2B"). Typically, the main surface 2A is a surface to be joined to a heat dissipation fin or the like, and the main surface 2B is a surface to be connected to another component such as a power element.

In the heat dissipation member 1, the main surface 2A is curved to be convex in an outward direction instead of in an inward direction of the heat dissipation member 1. In addition, the main surface 2B is curved to be convex in the inward direction instead of the outward direction of the heat dissipation member 1 (is curved to be concave in the outward direction of the heat dissipation member 1).

FIG. 2 is a diagram showing only the main surface 2B of the heat dissipation member 1.

Figure 3:
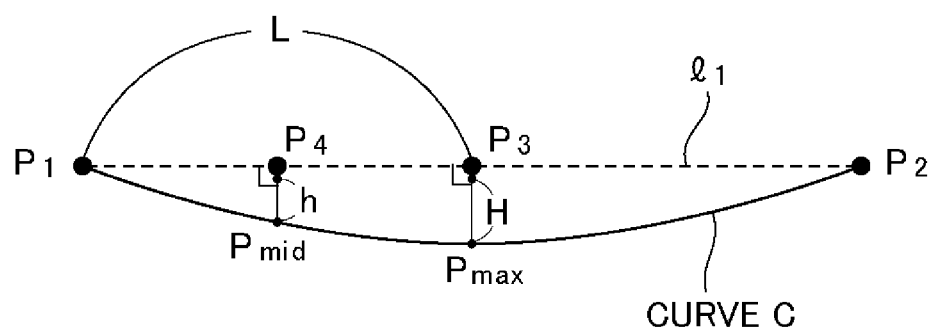
FIG. 3 is a cross-sectional view showing the other main surface of the heat dissipation member according to the embodiment taken along a cross-section β of FIG. 2.

In addition, FIG. 3 shows a curve C of the main surface 2B in a cross-sectional view of the heat dissipation member 1 showing a surface β (taken along the surface β) that is substantially perpendicular to the heat dissipation member 1 and passes both middle points of two short sides of the main surface 2B.

It is preferable that the curve C is substantially bilaterally symmetrical. That is, "the degree of curve" of the curve C is substantially uniform in the left-right direction.

In the curve C shown in FIG. 3,
a straight line passing through both endpoints $P_1$ and $P_2$ of the curve C is represented by $l_1$ (indicated by a broken line),
a point at which a distance to $l_1$ on the curve C is maximum is represented by $P_{max}$,
an intersection point between $l_1$ and a perpendicular drawn from $P_{max}$ to $l_1$ is represented by $P_3$,
a middle point of a line segment $P_1P_3$ is represented by $P_4$,
an intersection point between the curve C and a straight line that passes through $P_4$ and is perpendicular to $l_1$ is represented by $P_{mid}$,
a length of the line segment $P_1P_3$ is represented by L,
a length of a line segment $P_3P_{max}$ is represented by H, and
a length of a line segment $P_4P_{mid}$ is represented by h.

When the curve C is bilaterally symmetrical, $P_3$ is substantially the middle point of the line segment $P_1P_2$.

At this time, in the heat dissipation member 1, (2 h/L)/(H/L) is 1.1 or more.

The technical significance of "(2 h/L)/(H/L) being 1.1 or more" can be described as follows.

H/L is associated with the degree of "overall" curve of the main surface 2B in the surface β (in the long side direction of the heat dissipation member 1). H/L can also be referred to as the amount of curve per unit length.

On the other hand, 2 h/L is associated with the degree of local curve of "portion close to an end" of the main surface 2B in the surface β (in the long side direction of the heat dissipation member 1) (it is noted that 2 h/L=h/(L/2)). Here, "the portion close to the end" of the main surface 2B is specifically a portion from the point $P_1$ to the point $P_{mid}$ in FIG. 3.

As a result, (2 h/L)/(H/L) being 1.1 or more represents that, in the surface β, the degree of curve of "the portion close to the end" of the main surface 2B is sufficiently higher than the degree of overall curve of the main surface 2B.

In other words, in at least the main surface 2B of the heat dissipation member 1, the degree of curve of a portion (accordingly, a particularly highly deformed portion) to which a particularly strong strength is applied when the heat dissipation member 1 is joined to another component with a fixing member such as a screw is relatively high, whereas the degree of curve of the vicinity of the center (portion to which a component such as a power element is to be connected) is relatively low.

By designing the heat dissipation member 1 as described above, when a power element is connected to the vicinity of the center of the heat dissipation member 1, an advantageous effect of improving manufacturing stability can be obtained in that, for example, alignment or connection of the component itself can be easily performed.

On the other hand, the degree of curve of a portion close to an end of the heat dissipation member 1, that is, a portion to which a particularly strong strength is applied when the heat dissipation member 1 is joined to another component (for example, a heat dissipation fin) with a fixing member such as a screw is relatively high. As a result, when the heat dissipation member 1 is joined to another component with a fixing member, the heat dissipation member 1 can be easily made to be more "flat" "as a whole". As a result, "gap" between the heat dissipation member 1 and the other component (for example, a heat dissipation fin) can be reduced, and joinability and heat dissipation can be further improved.

(2 h/L)/(H/L) may be 1.1 or more, preferably 1.3 or more and 2.0 or less, and more preferably 1.4 or more and 1.6 or less. By adjusting (2 h/L)/(H/L) to be 2.0 or less, the heat dissipation member 1 can be easily made to be "flat" with an appropriate (not excessively high) force.

The heat dissipation member 1 will be described in more detail.

[Degree of Overall Curve (H/L)]

By appropriately designing the value of H/L representing the degree of "overall" curve of the main surface 2B or the amount of curve per unit length, that is, by appropriately designing the degree of curve of the heat dissipation member 1 as a whole, the main surface 2B can be easily made to be "flat" to a just right degree with a force by a typical fixing member (for example, a screw). That is, the joinability between the heat dissipation member 1 and another component can be further improved.

Specifically, H/L is preferably $5.0 \times 10^{-4}$ or more and $6.0 \times 10^{-3}$ or less and more preferably $1.0 \times 10^{-3}$ or more and $3.0 \times 10^{-3}$ or less.

[Degree of Curve or the like in "Short Side Direction" of Heat Dissipation Member 1]

In the above description, the degree of overall curve, the degree of local curve, and the like in "the direction of the surface β" (in the long side direction of the heat dissipation member 1) of FIG. 2 have been quantitatively described. Likewise, by appropriately designing the degree of overall curve, the degree of local curve, and the like in "the direction of a surface γ" (in the short side direction of the heat dissipation member 1) of FIG. 2, easy connection of a power element, joinability to a heat dissipation fin, and the like can be further improved.

Figure 4:
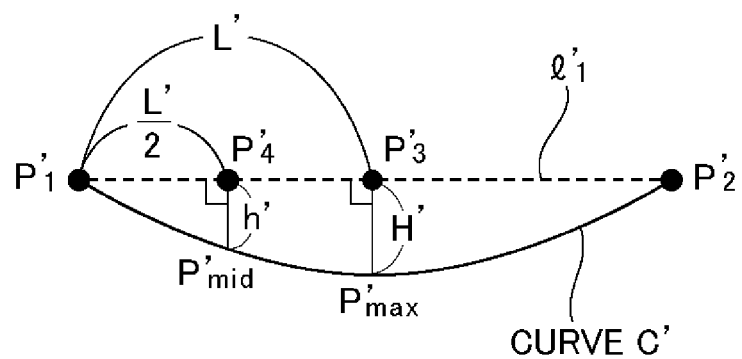
FIG. 4 is a cross-sectional view showing the other main surface of the heat dissipation member according to the embodiment taken along a cross-section γ of FIG. 2.

FIG. 4 shows a curve C' of the main surface 2B of the heat dissipation member 1 of FIG. 2 in a cross-sectional view of the heat dissipation member 1 showing the surface γ (taken along the surface γ) that is substantially perpendicular to the heat dissipation member 1 and passes both middle points of two long sides of the main surface 2B.

In the curve C' shown in FIG. 4,
a straight line passing through both endpoints $P_1'$ and $P_2'$ of the curve C' is represented by $l_1'$ (indicated by a broken line),
a point at which a distance to $l_1'$ on the curve C' is maximum is represented by $P_{max}'$,
an intersection point between $l_1'$ and a perpendicular drawn from $P_{max}'$ to $l_1'$ is represented by $P_3'$,
a middle point of a line segment $P_1'P_3'$ is represented by $P_4'$,
an intersection point between the curve C' and a straight line that passes through $P_4'$ and is perpendicular to $l_1'$ is represented by $P_{mid}'$,
a length of the line segment $P_1'P_3'$ is represented by L',
a length of a line segment $P_3'P_{max}'$ is represented by H', and
a length of a line segment $P_4'P_{mid}'$ is represented by h'.

When the curve C' is bilaterally symmetrical, $P_3'$ is substantially the middle point of the line segment $P_1'P_2'$.

At this time, in the heat dissipation member 1, (2 h'/L')/(H'/L') is preferably 1.1 or more, more preferably 1.3 or more and 2.0 or less, and still more preferably 1.4 or more and 1.6 or less.

By designing the degree of curve of "the portion close to an end" of the main surface 2B not only in "the direction of the surface β" (the long side direction of the heat dissipation member 1) of FIG. 2 and but also in "the direction of the surface γ" (the short side direction of the heat dissipation member 1) of FIG. 2 to be appropriately high, easy connection of a power element, joinability to a heat dissipation fin, and the like can be further improved.

[Regarding Main Surface 2A]

In the heat dissipation member 1, in particular, by appropriately designing the curved shape of the main surface 2B side, the effect of, for example, improving the manufacturing stability during the manufacturing of a power module can be obtained, and it is preferable to appropriately design the curved shape of the main surface 2A side.

Specifically, as in the main surface 2B except that the main surface 2A is curved to be convex in the outward direction instead of in the inward direction of the heat dissipation member 1, it is preferable that the curved shape of the main surface 2A is formed such that the degree of curve of "the portion close to an end" is relatively high and the degree of curve of the vicinity of the center is relatively low.

More quantitatively, when L, H, h, L', H', h', and the like of the main surface 2A are defined with respect to the drawing where "the main surface 2B" of FIG. 2 is replaced with "the main surface 2A", it is preferable that the relationship between L, H, and h in the main surface 2A is the same as that in the main surface 2B (for example, (2 h/L)/(H/L) is 1.1 or more). The relationship between L', H', and h' is also the same (for example, (2 h'/L')/(H'/L') is 1.1 or more).

Supplementarily, it is preferable to design the main surface 2A as described above from the viewpoint of easily manufacturing the heat dissipation member 1. The heat dissipation member 1 in which the degrees of curve of the main surface 2A and the main surface 2B are substantially the same can be relatively easily manufactured by heating press or the like described below.

[Through Hole]

It is preferable that a through hole is provided in a peripheral portion of the heat dissipation member 1. By joining the heat dissipation member 1 to another component (for example, a heat dissipation fin) using the through hole, a final product (for example, a power device) having excellent heat dissipation can be obtained.

Here, "peripheral portion" can be defined as a portion corresponding to at least any one of the following (1) and (2) in a top view of the heat dissipation member 1 from the main surface 2B side.

(1) A region within L/3 from a long side of the heat dissipation member 1 (main surface 2B) (peripheral portion of a long side)

(2) A region within L'/3 from a short side of the heat dissipation member 1 (main surface 2B) (peripheral portion of a short side)

In summary, it is preferable that the through hole is included in the region (1) or (2) (or in a region where (1) and (2) overlap each other).

In particular, it is preferable that the through hole is provided in the peripheral portion of a long side of the heat dissipation member 1 (the region (1) or the region where (1) and (2) overlap each other).

It is necessary that the heat dissipation member 1 has specific curve in the short side direction (in the direction of the surface β in FIG. 2). Accordingly, by providing the through hole in the peripheral portion of a long side of the heat dissipation member 1 and joining the heat dissipation member 1 to another component (for example, a heat dissipation fin) through the through hole with a screw, the flatness of the main surface 2B particularly in the short side direction can be further improved.

From the viewpoint of, for example, stably joining the heat dissipation member 1 to another component, the number of through holes is preferably 4 or more, more preferably 4 or more and 8 or less, and still more preferably 4 or more and 6 or less.

In particular, it is preferable that the heat dissipation member 1 includes at least one through hole in the region where (1) and (2) overlap each other (that is, the peripheral portion of four corners of the heat dissipation member 1). As a result, when the heat dissipation member 1 is screwed to another component, the generation of unintended strain, stress, or the like can be minimized.

The diameter of the through hole is, for example, 5 mm or more and 9 mm or less and preferably 6 mm or more and 8 mm or less.

Just to make sure, a unit that joins the heat dissipation member 1 to another component is not limited to a screw. For example, the heat dissipation member 1 may be joined to another component using a dedicated jig capable of attaching the heat dissipation member 1 to another component.

[Manufacturing Method/Material]

A method of manufacturing the heat dissipation member according to the embodiment is not particularly limited and can be manufactured appropriately using a well-known method.

It is preferable that the heat dissipation member according to the embodiment can be manufactured through steps including: a preparation step of preparing a metal-silicon carbide composite containing aluminum or magnesium (hereinafter, simply referred to as "preparation step"); and a heating press step of interposing the metal-silicon carbide composite between convex and concave molds and heating and pressing the metal-silicon carbide composite (hereafter, simply referred to as "heating press step"). In other words, the heat dissipation member according to the embodiment can be manufactured by preparing a flat metal-silicon carbide composite having no curve or small curve first, interposing the metal-silicon carbide composite between convex and concave molds having an appropriate curved shape, and heating and pressing the metal-silicon carbide composite.

Hereinafter, the preparation step and the heating press step will be described.

(Preparation Step)

A method that is preferably used for manufacturing the metal-silicon carbide composite containing aluminum or magnesium is a high-pressure forging method of impregnating a porous body with a metal at a high pressure. More specifically, squeeze casting or die casting can be adopted. In the high-pressure forging method, a porous silicon carbide body (preform) is charged into a high-pressure container, and is impregnated with molten metal containing aluminum or magnesium at a high pressure to obtain a composite.

For manufacturing the metal-silicon carbide composite, squeeze casting is more preferable due to the reason that a large number of products can be stably manufactured. Hereinafter, the manufacturing method using squeeze casting will be described.

Manufacturing of Porous Silicon Carbide Body (SiC Preform)

In order to manufacture the metal-silicon carbide composite, first a flat porous silicon carbide body (SiC preform) is formed.

The manufacturing method is not particularly limited, and a well-known method can be manufactured. For example, the porous silicon carbide body can be manufactured by adding silica, alumina, or the like as a binder to silicon carbide (SiC) powder as a raw material, mixing the components, molding and calcinating the mixture at 800° C. or higher. Here, silica, alumina, or the like may be used as a raw material, and the porous silicon carbide body does not need to be formed of only silicon carbide as a chemical component. For example, the porous silicon carbide body only needs to be formed of 50 mass % or higher of silicon carbide with respect to the total mass.

A molding method is not particularly limited, press molding, extrusion molding, cast molding, or the like can be used. Optionally, a binder for shape retention can be used in combination.

Important characteristics of the metal-silicon carbide composite obtained by impregnating the porous silicon carbide body with a metal containing aluminum or magnesium are thermal conductivity and a thermal expansion coefficient. It is preferable that the SiC content in the porous silicon carbide body is high because the thermal conductivity is high and the thermal expansion coefficient is low. It is noted that, when the content is excessively high, the porous silicon carbide body is not sufficiently impregnated with a metal.

In practice, suitably, 40 mass % or higher of coarse SiC particles having an average particle size of preferably 40 μm or more are contained, and the relative density of the SiC preform is preferably in a range of 55% or higher and 75% or lower. The bending strength of the porous silicon carbide body (SiC preform) is preferably 3 MPa or higher in order to prevent fracturing during handling or impregnation. The average particle size can be measured by calculating the average value of particle sizes of 1000 particles using a scanning electron microscope (for example, "JSM-T200 model", manufactured by JEOL Ltd.) and an image analyzer (for example, manufactured by Nippon Avionics Co., Ltd.). In addition, the relative density can be measured using the Archimedes method or the like.

It is preferable that the particle size of the SiC powder as a raw material of the porous silicon carbide body (SiC preform) is adjusted by appropriately using coarse powder and fine powder in combination. As a result, the strength of the porous silicon carbide body (SiC preform) and the thermal conductivity of the heat dissipation member that is finally obtained can be improved at a high level.

Specifically, mixed powder obtained by mixing (i) SiC coarse powder having an average particle size of 40 μm or more and 150 μm or less and (ii) SiC fine powder having an average particle size of 5 μm or more and 15 μm or less is suitable. Here, regarding a ratio between the amount of (i) and the amount of (ii) in the mixed powder, the amount of (i) is 40 mass % or higher and 80 mass % or lower, and the amount of (ii) is preferably 20 mass % or higher and 60 mass % or lower.

The porous silicon carbide body (SiC preform) is obtained by, for example, degreasing and calcinating a compact of a mixture obtained by adding the binder to the SiC powder. When the calcination temperature is 800° C. or higher, a porous silicon carbide body (SiC preform) having a bending strength of 3 MPa or higher is likely to be obtained irrespective of the atmosphere during the calcination.

It is noted that, when the calcination is performed at a temperature exceeding 1100° C. in an oxidizing atmosphere, the oxidation of SiC is promoted, and the thermal conductivity of the metal-silicon carbide composite may decrease. Accordingly, it is preferable that the calcination is performed at a temperature of 1100° C. or lower in the oxidizing atmosphere.

The calcination time may be appropriately determined depending on conditions such as the size of the porous silicon carbide body (SiC preform), the amount of raw materials charged into a calcination furnace, or the calcination atmosphere.

When the porous silicon carbide body (SiC preform) is molded in a predetermined shape, a change in shape (for example, change in the amount of curve) caused by drying can be prevented by performing drying one by one or by performing drying using a spacer such as carbon having the same shape as the preform shape between SiC preforms. In addition, by performing the same process as that during drying for the calcination, a shape change caused by a change in internal structure can be prevented.

Impregnation with Metal

By impregnating the porous silicon carbide body (SiC preform) obtained as described above with a metal containing aluminum or magnesium using the high-pressure forging method or the like, the metal-silicon carbide composite can be obtained.

Examples of a method of obtaining the metal-silicon carbide composite by impregnating the porous silicon carbide body (SiC preform) with the metal (alloy) containing aluminum or magnesium include the following method.

First, the porous silicon carbide body (SiC preform) is set into a mold. Next, molten metal (metal containing aluminum or magnesium) is charged into the mold. By pressing the molten metal, voids of the porous silicon carbide body (SiC preform) are impregnated with the metal. Through cooling, the metal-silicon carbide composite is obtained.

Here, when the porous silicon carbide body (SiC preform) is set into the mold, it is preferable to preheat the mold. The preheating temperature is, for example, 500° C. or higher and 650° C. or lower. In order to prevent a temperature decrease, it is preferable that the molten metal is charged as rapidly as possible after setting the porous silicon carbide body (SiC preform) into the mold.

When the porous silicon carbide body (SiC preform) is impregnated with the metal to obtain the metal-silicon carbide composite, a surface metal layer may be provided on a surface (for example, a main surface) of the metal-silicon carbide composite. As a result, a heat dissipation member in which the surface metal layer (specifically, the surface metal layer containing aluminum or magnesium) is provided on surfaces such as two main surfaces can be obtained.

For example, a mold having a slightly larger dimension than the dimension of the SiC preform is prepared as the mold for the impregnation, the SiC preform is disposed in the mold, and the molten metal is poured thereinto. As a result, the surface metal layer can be provided.

In another example, the surface metal layer can be provided by impregnating the SiC preform with the metal in a state where one or more kinds among fibers, spherical particles, and crushed particles formed of alumina or silica are disposed to be in direct contact with the surface of the SiC preform. At this time, the content of the material including one or more kinds among fibers, spherical particles, and crushed particles formed of alumina or silica in the surface metal layer is preferably 5 mass % or higher and 40 mass % or lower and more preferably 10 mass % or higher and 20 mass % or lower with respect to the mass of the metal-silicon carbide composite.

In still another example, the surface metal layer can be provided using a method of disposing a thin sheet or a thin film of the metal on the surface of the SiC preform and then impregnating the SiC preform with the metal, a method of providing a groove or the like on the surface of the SiC preform in advance, or the like.

The press pressure of the molten metal is not particularly limited as long as the metal can be sufficiently impregnated, and is, for example, 30 MPa or higher.

It is preferable that the melting point of the metal (preferably, the alloy containing aluminum or magnesium) to be impregnated is appropriately low so as to sufficiently permeate into the voids of the preform.

From this viewpoint, for example, an aluminum alloy containing 7 mass % or higher and 25 mass % or lower of silicon is preferable. Further, it is preferable that 0.2 mass % or higher and 5 mass % or lower of magnesium is contained from the viewpoint that the binding between the silicon carbide particle and the metal portion becomes more strong. Metal components in the aluminum alloy other than aluminum, silicon, and magnesium are not particularly limited within a range where characteristics do not change extremely. For example, copper may be included.

As the aluminum alloy, for example, AC4C, AC4CH, or ADC12 that is an alloy for forging can be preferably used.

Incidentally, in order to remove strain generated during the impregnation, an annealing treatment may be performed on the metal-silicon carbide composite. The annealing treatment can be performed, for example, under conditions of a temperature of about 400° C. or higher and 550° C. or lower and 10 minutes or longer.

The metal-silicon carbide composite (flat plate-shaped) obtained in the above-described preparation step is typically flat or has uncontrolled curve. However, for example, through the following heating press step, a heat dissipation member to which appropriate curve is imparted can be obtained.

Heating Press Step

Figure 5:
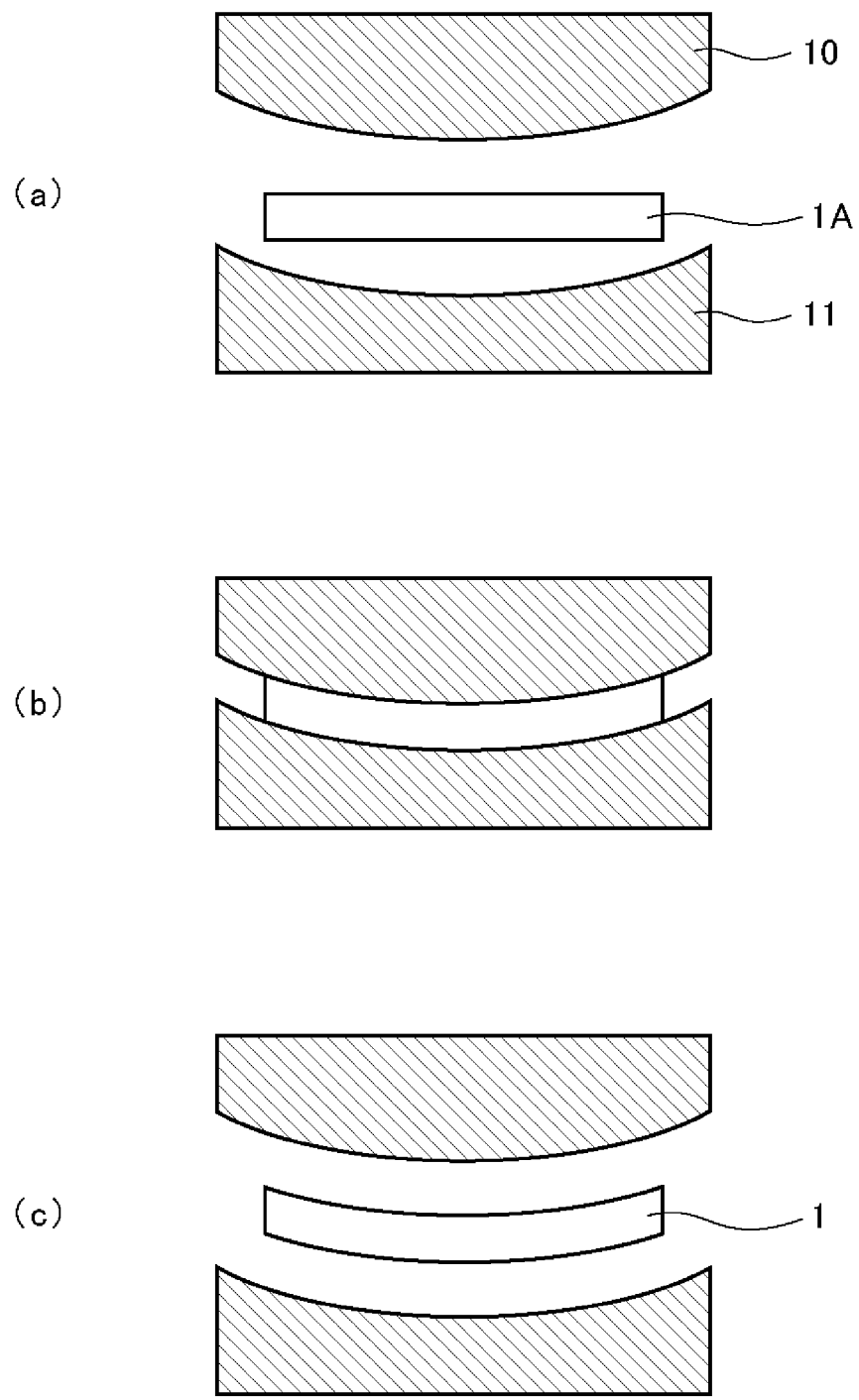
FIG. 5 is a diagram showing "heating press" in steps of manufacturing the heat dissipation member according to the embodiment.

In the heating press step, for example, as shown in FIG. 5(a), FIG. 5(b), and FIG. 5(c), a metal-silicon carbide composite 1A is interposed between a press convex mold 10 and a press concave mold 11 and is heated and pressed (pressed while being heated). As a result, the heat dissipation member 1 to which predetermined curve is imparted can be obtained.

The press convex mold 10 and the press concave mold 11 are processed in a shape such that the predetermined curve is imparted to the heat dissipation member 1. For example, as the press convex mold 10, a mold having a relatively small curvature in a center portion and a relatively large curvature in a portion distant from the center portion can be used. The same is applicable to the press concave mold 11.

Typically, the form of a convex portion of the press convex mold 10 and the form of a concave portion of the press concave mold 11 are substantially the same. That is, typically, when the press convex mold 10 and the press concave mold 11 overlap each other without interposing the metal-silicon carbide composite 1A therebetween, there is substantially no gap between the press convex mold 10 and the press concave mold 11.

Materials of the press convex mold 10 and the press concave mold 11 are not particularly limited and may be any one as long as they are not substantially deformed under temperature and pressure conditions described below. Specifically, a ceramic such as carbon or boron nitride or a metal material such as cemented carbide or stainless steel is preferably used.

As long as the heat dissipation member 1 to which appropriate curve is imparted can be obtained, the heating temperature during the heating press is not particularly limited. However, from the viewpoints of obtaining productivity and reducing the pressure, it is preferable that the heating temperature is as high as possible within a range where the metal in the metal-silicon carbide composite 1A does not melt. In the embodiment, the heating temperature is preferably 450° C. or higher and 550° C. or lower in consideration of the fact that the metal in the metal-silicon carbide composite 1A is aluminum, magnesium, or the like (including an alloy thereof).

As long as the heat dissipation member 1 to which appropriate curve is imparted can be obtained, the pressure during the heating press is not particularly limited. The pressure may be appropriately adjusted depending on the thickness of the metal-silicon carbide composite 1A, the heating temperature, and the like. However, from the viewpoint of obtaining productivity, reliably imparting curve to the metal-silicon carbide composite 1A, and the like, the pressure is preferably 10 kPa or higher and more preferably 30 kPa or higher and 250 kPa or lower.

As long as the heat dissipation member 1 to which appropriate curve is imparted can be obtained, the time during the heating press is not particularly limited. However, from the viewpoint of, for example, reliably imparting curve to the metal-silicon carbide composite 1A, for example, the time at which the temperature of the metal-silicon carbide composite 1A itself is 450° or higher is preferably 30 seconds or longer and more preferably 30 seconds or longer and 300 seconds or shorter.

In order to obtain desired curve, the heating press step may be performed multiple times. For example, after performing the first heating press step using the first press convex mold 10 and the first press concave mold 11, the second heating press step may be performed using the second press convex mold 10 and the second press concave mold 11 having a curved shape different from that of the first press convex mold 10 and the first press concave mold 11.

After the heating press, the metal-silicon carbide composite 1A is cooled. Cooling may be, for example, rapid cooling or air cooling. The curve may change depending on a cooling method. Therefore, in order to obtain desired curve, it is preferable to appropriately set cooling conditions.

That is, in order to obtain the heat dissipation member 1 to which appropriate curve is imparted, it is preferable to use the press convex mold 10 and the press concave mold 11 having an appropriate shape and to appropriately adjust and optimize the temperature and time of the heating press, a specific cooling method after the heating press, and the like. Incidentally, the adjustment and optimization described herein is not that difficult by grasping the degree of curve through some preliminary experiments.

The method of manufacturing the heat dissipation member according to the embodiment may include another step other than the above-described steps.

For example, a step of providing the hole for screwing may be provided. Specifically, the hole for screwing for joining to another component can be provided by mechanical processing or the like. Since a position where the hole for screwing is provided and the like are as described above, the description thereof will not be repeated.

A step of providing the hole for screwing can be performed, for example, between the preparation step and the heating press step. Alternatively, the step of providing the hole for screwing can be performed after the heating press step.

In addition, a step of mechanically processing at least a part of the surface of the heat dissipation member 1 may be performed. Here, "mechanical processing" includes cutting, grinding, polishing, and the like.

For example, by finely adjusting the curved shape of the main surface 2A and/or the main surface 2B of the heat dissipation member 1 by mechanical processing, the connection to a power element can be performed more easily, or the joinability to a heat dissipation fin can be further improved.

In addition, it is presumed that, for example, by polishing the surface of the heat dissipation member 1 (for example, the main surface 2A or 2B), the surface roughness can be appropriately adjusted, and the connectivity of a power element or the joinability to a heat dissipation fin or the like can be further improved.

Hereinabove, the embodiment of the present invention has been described. However, the embodiment is merely an example of the present invention, and various configurations other than the above-described configurations can be adopted. In addition, the present invention is not limited to the above-described embodiments, and modifications, improvements, and the like within a range where the object of the present invention can be achieved are included in the present invention.

EXAMPLES

The embodiments of the present invention will be described in more detail based on Examples and Comparative Examples. The present invention is not limited to Examples.

<Manufacturing of Heat Dissipation Member>

Example 1

(Formation of Porous Silicon Carbide Body)

300 g of silicon carbide powder A (manufactured by Pacific Rundrum Co., Ltd.: NG-150, average particle size: 100 μm), 150 g of silicon carbide powder B (manufactured by Yakushima Denko Co., Ltd.: GC-1000F, average particle size: 10 μm), and 30 g of silica sol (manufactured by Nissan Chemical Corporation: SNOWTEX) were mixed with each other using a stirring mixer for 30 minutes. The obtained mixture was put into a mold of 178 mm×128 mm×5.5 mm and was pressed at a pressure of 10 MPa. The obtained compact was calcinated in air at a temperature of 900° C. for 2 hours to obtain a porous silicon carbide body.

For the following step, 30 porous silicon carbide bodies having the same configuration were prepared.

Both surfaces of the porous silicon carbide body were interposed between stainless steel (SUS 304) sheets having a dimension of 210 mm×160 mm×0.8 mm and having both surfaces to which a release agent was applied, and 30 bodies were laminated. Further, an iron sheet having a thickness of 6 mm was disposed at both ends and fixed using bolts and nuts having a diameter of 10 mmφ such that one block was formed.

(Formation of Aluminum-Silicon Carbide Composite)

The above-described block was preheated using an electric furnace at a temperature of 600° C. Next, this block was put into a press mold having a void with an internal dimension of 400 mmφ×300 mm that was heated in advance.

Next, molten aluminum alloy having a temperature of 800° C. and having a composition including 12% of silicon, 1% of magnesium, and a remainder consisting of aluminum and inevitable impurities was poured into the press mold and was pressurized at a pressure of 100 MPa for 20 minutes. As a result, the porous silicon carbide body was impregnated with the aluminum alloy to obtain a metal block including the aluminum-silicon carbide composite.

The obtained metal block was cooled to room temperature and was cut along a side surface shape of a release sheet using a wet bandsaw to remove the interposed stainless steel sheets.

As a result, an aluminum-silicon carbide composite was obtained.

(Treatment after Impregnation)

The outer periphery of the obtained aluminum-silicon carbide composite was processed with an NC lathe such that the lengths were 180 mm×130 mm. Next, in the peripheral portion, through holes having a diameter of 7 mm were formed at eight positions, and countersunk holes having a diameter φ of 10-4 mm were formed at four positions.

(Imparting of Curve)

In order to impart curve to the aluminum-silicon carbide composite, a press convex mold and a press concave mold were prepared. Specifically, in order to obtain a desired curved shape, a press convex mold and a press concave mold having a relatively small curvature in a center portion and a relatively large curvature in a portion distant from the center portion were prepared.

The convex and concave molds were mounted on a heating press machine and were heated such that the surface temperature of the molds were 460° C. The aluminum-silicon carbide composite was disposed between the convex and concave molds and was pressed at 40 kPa. At this time, a thermocouple was brought into contact with a side surface of the composite to measure the temperature. After the temperature of the composite reached 450° C., the composite was held at this temperature for 3 minutes, the pressurization was released, the composite was naturally cooled to room temperature.

Next, the composite was blasted and cleaned with alumina abrasive grains under conditions of pressure: 0.4 MPa, transport speed: 1.0 m/min. Further, next, electroless Ni—P plating and Ni—B plating were performed. As a result, a plating layer having a thickness of 8 μm (Ni—P: 6 μm, Ni—B: 2 μm) was formed on the surface of the composite.

As a result, a heat dissipation member was obtained.

(Measurement of Various Parameters)

Using a laser three-dimensional shape measuring system having the following configuration, data relating to the shapes of the main surface 2A and the main surface 2B were obtained, and the data was analyzed to obtain L, H, h, L', H', and h' (the definitions of these symbols are as described above).

Device: laser three-dimensional shape measuring system (a system obtained by integrating the following four devices)

XYθ stage unit: K2-300 (manufactured by Kohzu Precision Co., Ltd.)

High-accuracy laser displacement sensor: LK-G500 (manufactured by Keyence Corporation)

Motor controller: SC-200K (manufactured by Kohzu Precision Co., Ltd.)

AD converter: DL-100 (manufactured by Kohzu Precision Co., Ltd.)

Examples 2 to 7

Heat dissipation members were prepared using the same method as that of Example 1, except that the lengths of a long side and a short side of the heat dissipation member and the curved shapes of the press convex mold and the press concave mold in the above (Imparting of Curve) were changed. Next, various numerical values were measured using the same methods as those of Example 1.

Comparative Example 1

In Comparative Example 1, a heat dissipation member was prepared through the same steps as those of Example 1, except that, the curved shapes of the convex and concave molds were changed.

Various numerical values are collectively shown in Table 1.

Just to make sure, the values of L, H, h, and the like shown in Table 1 are values measured for the main surface (the other main surface; the main surface 2B in FIG. 1(b)) curved to be convex in the inward direction of the heat dissipation member.

Numerical values relating to the degree of curve the main surface (the one main surface; the main surface 2A in FIG. 1(b)) curved to be convex in the outward direction of the heat dissipation member are not shown in Table 1. However, this main surface substantially the same curved shape except that the direction of curve is opposite. Specifically, when h was measured with respect to the drawing where "the main surface 2B" of FIG. 2 is replaced with "the main surface 2A", the value of (h in the main surface 2B)/(h in the main surface 2A) was about 1.0.

(Evaluations such as Manufacturing Stability of Power Module)

10 heat dissipation members were prepared for each of Examples and Comparative Examples, and these members were connected to a simulated power element. As a result, a substrate for a simulated power module was manufactured.

As a specific manufacturing procedure, using a device that is typically used for manufacturing a power module, a ceramic substrate (substrate having both surfaces where a metal layer such as copper or aluminum was provided) was soldered to six specific positions of the main surface 2B among two main surfaces of the heat dissipation member according to each of Examples and Comparative Examples. As a result, a substrate for a simulated power module was obtained.

Next, in order to obtain a simulated power module, case providing, resin sealing, and cover providing were performed on the substrate for a simulated power module. As a result, a simulated power module was obtained.

The obtained simulated power module was investigated for whether or not a defect causing a problem relating to mass production was present.

In all the simulated power modules manufactured using the heat dissipation members according to Examples, a defect causing a problem relating to mass production was not present.

In addition, the heat dissipation member according to each of Examples 1 to 7 was joined to a heat dissipation fin with a screw, and adhesion between the heat dissipation member and the heat dissipation fin, heat dissipation, and the like were evaluated. As a result, the adhesion and the heat dissipation were excellent.

On the other hand, in Comparative Example 1, a tool for aligning the ceramic substrate was not suitably fitted, and it was difficult to perform the connection of the component itself.

It can be found from the above results that, by using the heat dissipation member having a relatively high degree of curve in "the portion close to an end" as in Examples 1 to 7, the productivity during the manufacturing of a power module can be improved, and heat dissipation can be improved.

The present application claims priority based on Japanese Patent Application No. 2019-013765 filed on Jan. 30, 2019, the entire content of which is incorporated herein by reference.

TABLE 1

|  | Press Temperature | Press Pressure | Press Time | Various Dimensions in Long Side Direction | | | | | Various Dimensions in Short Side Direction | | | |
|---|---|---|---|---|---|---|---|---|---|---|---|---|
|  |  |  |  | L | h | H | (2 h/L)/ (H/L) | H/L | L' | h' | H' | (2 h'/L')/ (H'/L') |
| Unit and the like | °C. | kPa | min | mm | μm | μm | — | ×10⁻³ | mm | μm | μm | ×10⁻³ |
| Example 1 | 460 | 40 | 3 | 90 | 154 | 207 | 1.488 | 2.300 | 65 | 81 | 104 | 1.558 |
| Example 2 | 460 | 40 | 3 | 90 | 172 | 306 | 1.124 | 3.400 | 65 | 95 | 157 | 1.210 |
| Example 3 | 460 | 40 | 3 | 90 | 388 | 409 | 1.897 | 4.544 | 65 | 191 | 199 | 1.920 |
| Example 4 | 460 | 40 | 3 | 90 | 41 | 46 | 1.783 | 0.511 | 65 | 28 | 35 | 1.600 |
| Example 5 | 460 | 40 | 3 | 90 | 325 | 533 | 1.220 | 5.922 | 65 | 184 | 281 | 1.310 |
| Example 6 | 460 | 40 | 3 | 120 | 258 | 308 | 1.675 | 2.567 | 70 | 142 | 152 | 1.868 |
| Example 7 | 460 | 40 | 3 | 48 | 34 | 57 | 1.193 | 1.188 | 22 | 20 | 29 | 1.379 |
| Comparative Example 1 | 460 | 40 | 3 | 90 | 96 | 193 | 0.995 | 2.144 | 65 | 46 | 111 | 0.829 |

The invention claimed is:

1. A plate-shaped heat dissipation member comprising a metal-silicon carbide composite containing aluminum or magnesium, wherein the heat dissipation member is substantially rectangular, among two main surfaces of the heat dissipation member, one main surface is curved to be convex in an outward direction of the heat dissipation member and the other main surface is curved to be convex in an inward direction of the heat dissipation member, and in a curve C of the other main surface in a cross-sectional view of the heat dissipation member showing a cross-section that is substantially perpendicular to the heat dissipation member and passes both middle points of two short sides of the other main surface, when a straight line passing through both endpoints $P_1$ and $P_2$ of the curve C is represented by $l_1$, a point at which a distance to $l_1$ on the curve C is maximum is represented by $P_{max}$, an intersection point between $l_1$ and a perpendicular drawn from $P_{max}$ to $l_1$ is represented by $P_3$, a middle point of a line segment $P_1P_3$ is represented by $P_4$, an intersection point between the curve C and a straight line that passes through $P_4$ and is perpendicular to $l_1$ is represented by $P_{mid}$, and a length of the line segment $P_1P_3$ is represented by L, a length of a line segment $P_3P_{max}$ is represented by H, and a length of a line segment $P_4P_{mid}$ is represented by h, (2h/L)/(H/L) is 1.1 or more, and wherein the curvature of a center portion of the other main surface is smaller than that of a portion distant from the center portion of the other main surface.

2. The heat dissipation member according to claim 1, wherein a surface metal layer containing aluminum or magnesium is provided on the one main surface and the other main surface.

3. The heat dissipation member according to claim 1, in a curve C' of the other main surface in a cross-sectional view of the heat dissipation member showing a cross-section that is substantially perpendicular to the heat dissipation member and passes both middle points of two long sides of the other main surface, when a straight line passing through both endpoints $P_1'$ and $P_2'$ of the curve C' is represented by $l_1'$, a point at which a distance to $l_1'$ on the curve C' is maximum is represented by $P_{max}'$, an intersection point between $l_1'$ and a perpendicular drawn from $P_{max}'$ to $l_1'$ is represented by $P_3'$, a middle point of a line segment $P_1'P_3'$ is represented by $P_4'$, an intersection point between the curve C' and a straight line that passes through $P_4'$ and is perpendicular to $l_1'$ is represented by $P_{mid}'$, and a length of the line segment $P_1'P_3'$ is represented by L', a length of a line segment $P_3'P_{max}'$ is represented by H', and a length of a line segment $P_4'P_{mid}'$ is represented by h', (2h'/L')/(H'/L') is 1.1 or more.

4. The heat dissipation member according to claim 1, wherein a value of H/L is $5.0 \times 10^{-4}$ or more and $6.0 \times 10^3$ or less.

5. The heat dissipation member according to claim 1, wherein a through hole is provided in a peripheral portion.

6. The heat dissipation member according to claim 5, wherein the through hole is provided in a peripheral portion of a long side of the heat dissipation member.

7. The heat dissipation member according to claim 6, wherein four or more through holes are provided in the peripheral portion of the long side of the heat dissipation member.

8. A method of manufacturing the heat dissipation member according to claim 1, the method comprising:

a preparation step of preparing a metal-silicon carbide composite containing aluminum or magnesium; and a heating press step of interposing the metal-silicon carbide composite between convex and concave molds and heating and pressing the metal-silicon carbide composite.

* * * * *